(12) United States Patent
Chen et al.

(10) Patent No.: US 9,035,380 B2
(45) Date of Patent: May 19, 2015

(54) HIGH VOLTAGE DRAIN-EXTENDED MOSFET HAVING EXTRA DRAIN-OD ADDITION

(71) Applicant: Taiwan Semiconductor Manufacturing Company, Ltd., Hsin-Chu (TW)

(72) Inventors: Yi-Sheng Chen, Hsin-Chu (TW);
Chen-Liang Chu, Hsin-Chu (TW);
Shih-Kuang Hsiao, Hsin-Chu (TW);
Fei-Yun Chen, Hsin-Chu (TW);
Kong-Beng Thei, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 196 days.

(21) Appl. No.: 13/686,696

(22) Filed: Nov. 27, 2012

(65) Prior Publication Data

US 2014/0145261 A1    May 29, 2014

(51) Int. Cl.
*H01L 29/66*    (2006.01)
*H01L 29/78*    (2006.01)

(52) U.S. Cl.
CPC ...... *H01L 29/7823* (2013.01); *H01L 29/66681* (2013.01)

(58) Field of Classification Search
USPC .......................................................... 257/337
See application file for complete search history.

(56) References Cited

U.S. PATENT DOCUMENTS 5,492,847 A    2/1996    Kao et al.

OTHER PUBLICATIONS

Hussin, M.R.M., et al., "Blanket and Pocket Anti Punchthrough Device Design Approaches in 0.35-um CMOS Technology Development," ICSE2000 Proceedings, Nov. 2000, pp. 39-43.

*Primary Examiner* — Marvin Payen
(74) *Attorney, Agent, or Firm* — Slater & Matsil, L.L.P

(57) ABSTRACT

An integrated circuit includes a high-voltage well having a first doping type, a first doped region and a second doped region embedded in the high-voltage well, the first and second doped regions having a second doping type and spaced apart by a channel in the high-voltage well, source/drain regions formed in the first doped region and in the second doped region, each of the source/drain regions having the second doping type and more heavily doped than the first and second doped regions, first isolation regions spaced apart from each of the source/drain regions, and resistance protection oxide forming a ring surrounding each of the source/drain regions.

20 Claims, 6 Drawing Sheets

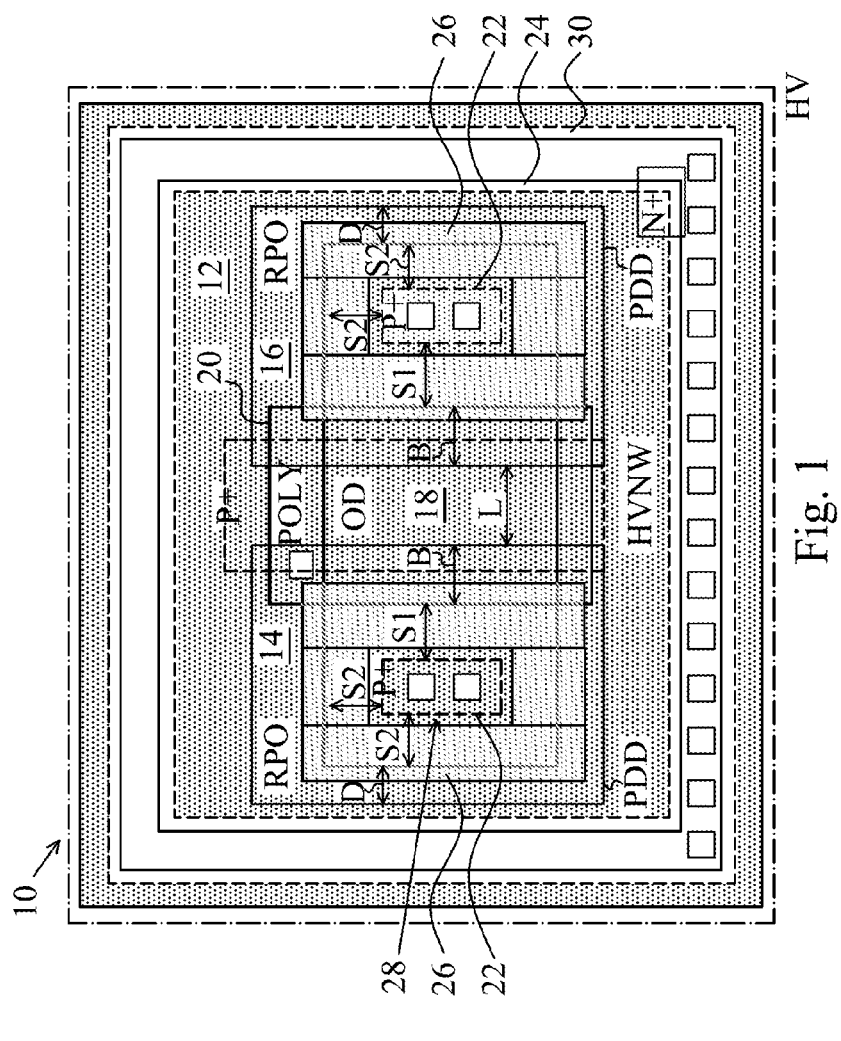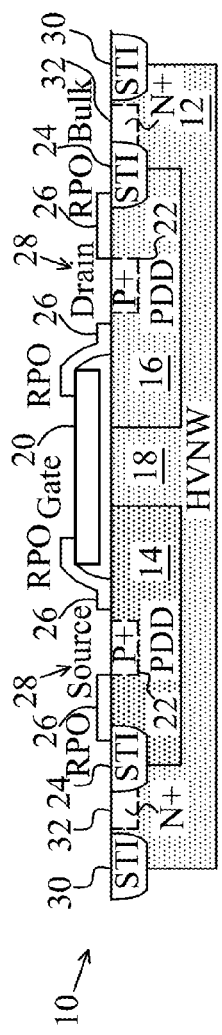
Fig. 1
Fig. 2

36

| C018 27V test vehicle WAT | | | | | | | | WAT |
|---|---|---|---|---|---|---|---|---|
| Structure | Device | W | L | B | S1 | D | S2 | Mean |
| W/O S2 | Asym_PMOS | 20 | 1.5 | 0.8 | 0.8 | 0.8 | NA | -1.047 |
| | | 20 | 1.5 | 0.8 | 0.8 | 0.8 | NA | -9.54 |
| | | 20 | 1.5 | 0.8 | 0.8 | 0.8 | NA | -32.00 |
| | | 20 | 1.5 | 0.8 | 0.8 | 0.8 | NA | -3.69 |
| W/O S2 | Sym_PMOS | 20 | 1.5 | 0.8 | 0.8 | 0.8 | NA | -0.977 |
| | | 20 | 1.5 | 0.8 | 0.8 | 0.8 | NA | -7.47 |
| | | 20 | 1.5 | 0.8 | 0.8 | 0.8 | NA | -32.13 |
| | | 20 | 1.5 | 0.8 | 0.8 | 0.8 | NA | -2.83 |
| | | 20 | 1.5 | 0.8 | 0.8 | 0.8 | NA | 0.03 |
| W/I S2 | Asym_PMOS | 20 | 1.5 | 0.8 | 0.8 | 0.8 | 0.8 | -1.016 |
| | | 20 | 1.5 | 0.8 | 0.8 | 0.8 | 0.8 | -9.59 |
| | | 20 | 1.5 | 0.8 | 0.8 | 0.8 | 0.8 | -37.60 |
| | | 20 | 1.5 | 0.8 | 0.8 | 0.8 | 0.8 | -2.95 |
| W/I S2 | Sym_PMOS | 20 | 1.5 | 0.8 | 0.8 | 0.8 | 0.8 | -0.956 |
| | | 20 | 1.5 | 0.8 | 0.8 | 0.8 | 0.8 | -7.28 |
| | | 20 | 1.5 | 0.8 | 0.8 | 0.8 | 0.8 | -37.43 |
| | | 20 | 1.5 | 0.8 | 0.8 | 0.8 | 0.8 | -2.94 |
| | | 20 | 1.5 | 0.8 | 0.8 | 0.8 | 0.8 | 0.02 |

Fig. 4

HIGH VOLTAGE DRAIN-EXTENDED MOSFET HAVING EXTRA DRAIN-OD ADDITION

BACKGROUND

The breakdown voltage of the traditional Double Diffused Drain (DDD) metal-oxide semiconductor (MOS) structure (DDDMOS) is limited. A rule extension will only slightly improve the device breakdown voltage when the dopant concentration is light. In addition, the insertion of a shallow trench isolation (STI) region under a polyimide gate will decrease the on resistance, commonly referred to as RDS(on), and will degrade the mismatch performance of the device.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1 is a top plan view of an embodiment DDDMOS device having a drain-active area (OD) addition in the form of a resistance protection oxide (RPO) forming a window;

FIG. 2 is a cross sectional view of the embodiment DDDMOS device of FIG. 1;

FIG. 4 is a chart illustrating wafer acceptance test (WAT) results for a standard DDDMOS device without the resistance protection oxide (RPO) forming a window relative to the embodiment DDDMOS device of FIG. 1;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 3:
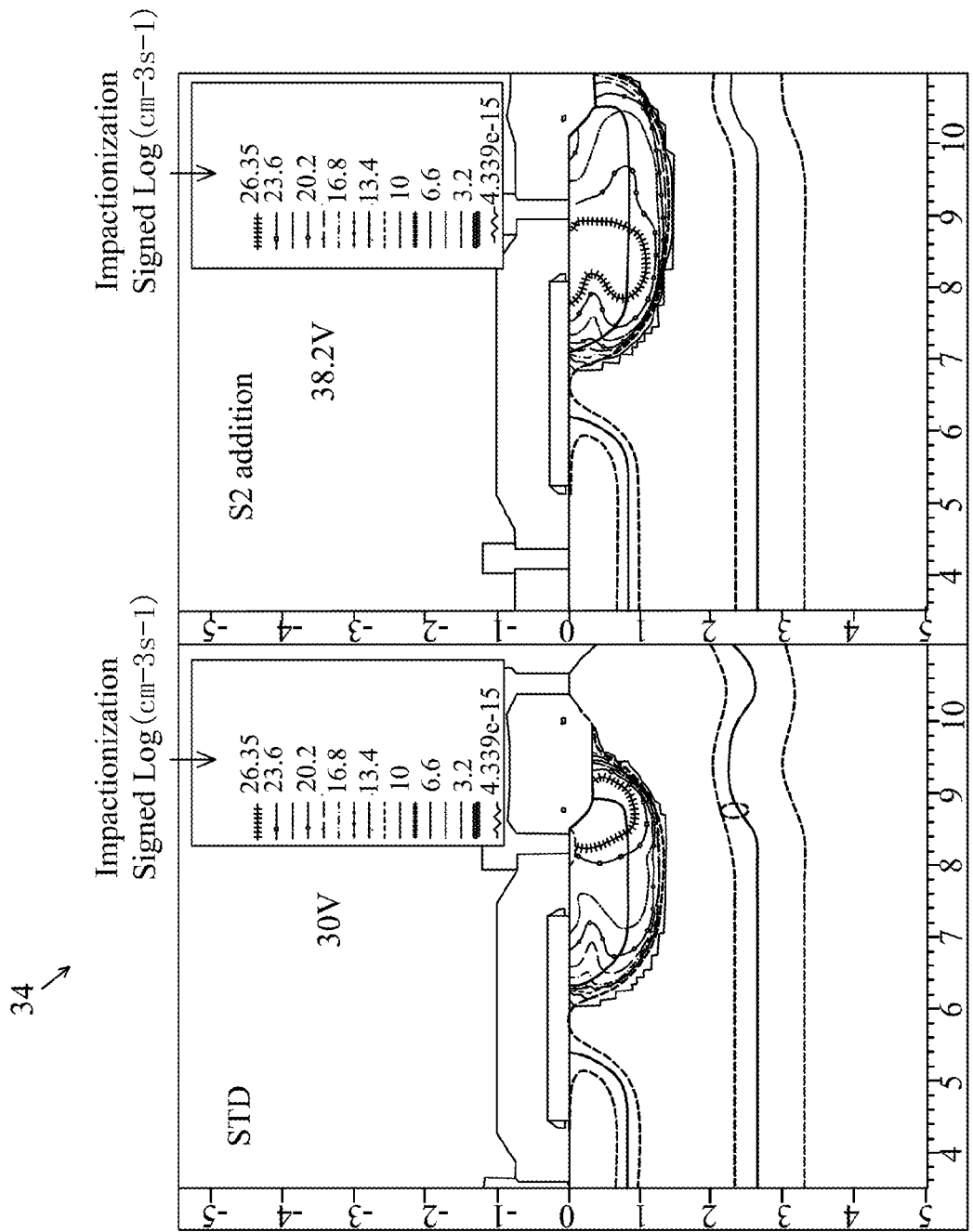
FIG. 3 is a simulation comparing the breakdown voltage expected for a standard DDDMOS device relative to the breakdown voltage expected for the DDDMOS device of FIG. 1.

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

The present disclosure will be described with respect to preferred embodiments in a specific context, namely a metal-oxide semiconductor (MOS) transistor (e.g., a Double Diffused Drain MOS (DDDMOS), etc.). The concepts in the disclosure may also apply, however, to integrated circuits or other semiconductor structures.

Referring collectively to FIGS. 1-2, an embodiment DDDMOS device 10 is illustrated. As will be more fully described below, the embodiment DDDMOS device 10 has a high breakdown voltage relative to conventional DDDMOS devices. The embodiment DDDMOS device 10 also has a comparable on resistance, which is often indicated by RDS (on)., and mismatch relative to conventional DDDMOS devices.

As shown in FIGS. 1-2, the DDDMOS device 10 includes a high-voltage well 12 having a first doping type (e.g., n-type). A first doped region 14 and a second doped region 16 are formed by implantation processes and embedded in the high-voltage well 12. In an embodiment, the first and second doped regions 14, 16 are lightly-doped drain regions. The first and second doped regions 14, 16 have a second doping type (e.g., p-type) and are spaced apart from each other by a channel 18 in the high-voltage well 12. The channel 18 is disposed beneath a gate 20. In an embodiment, the gate 20 is formed from a polysilicon or another suitable gate material.

Still referring to FIGS. 1-2, a source/drain region 22 is formed in the first doped region 14 and in the second doped region 16. Each of the source/drain regions 22 has the second doping type (e.g., p-type) and is more heavily doped than the first and second doped regions 14, 16. The heavier doping of the first and second doped regions 14, 16 is designated through use of the P+ symbol in FIG. 2. As shown in FIG. 1, the gate 20, the first and second doped regions 14, 16, and the source/drain regions 22 generally establish an active region (OD) for the DDDMOS device 10.

As shown in FIGS. 1-2, each of first isolation regions 24 is spaced apart from each of the source/drain regions 22. In an embodiment, the first isolation regions 24 comprise a shallow trench isolation (STI) region embedded in a portion of the first and second doped regions 14, 16 and in a portion of the high-voltage well 12. In other words, the first isolation regions 24 span across an interface between the first and second doped regions 14, 16 and the high-voltage well 12. In an embodiment, the first isolation regions 24 are laterally spaced apart from the source/drain regions 22 by portions of the first doped region 14 and portions of the second doped region 16.

Still referring to FIGS. 1-2, a resistance protection oxide (RPO) 26 forms a ring around each of the source/drain regions 22. As shown in FIG. 1, the ring of resistance protection oxide 26 defines a window 28 or opening that is generally aligned with or partially overlaps each of the source/drain regions 22. In an embodiment, the resistance protection oxide 26 overlies the first and second doped regions 14, 16 disposed between the source/drain regions 22 and the first isolation regions 24. In an embodiment, the resistance protection oxide 26 partially overlaps the first isolation regions 24. In an embodiment, the resistance protection oxide 26 includes a portion that is disposed on a side of the source/drain regions 22 opposite the channel 18.

As shown in FIG. 2, in an embodiment a portion of each of the rings of the resistance protection oxide 26 overlies the gate 20 disposed above the channel 18. In addition, in an embodiment an end of the resistance protection oxide 26 is vertically aligned with or partially overlaps an end of the source/drain regions 22 as shown in FIG. 2. Moreover, in an embodiment the ring 26 formed using the resistive protection oxide 26 is a square ring, a rectangular ring, and so on. It should be recognized that the ring may have other suitable shapes in other embodiments (e.g., circular, elliptical, triangular, or another closed polygon capable of forming a window).

Referring to FIG. 2, in an embodiment second isolation regions 30 are spaced apart from the first isolation regions 24 by a third doped region 32. The third doped region 32 has the first doping type (e.g., n-type) and is more heavily doped than the high-voltage well 12. The heavier doping of the third doped region 32 is designated through use of the N+ symbol in FIG. 2.

Referring now to FIG. 3, a simulation 34 comparing the breakdown voltage (i.e., 30 V) expected for a standard DDDMOS device 10 (labeled STD) relative to the breakdown voltage (e.g., 38.2 V) expected for the embodiment DDDMOS device 10 (labeled S2 addition) of FIG. 1 is provided. As shown, the breakdown voltage of the embodiment DDDMOS device 10 is significantly higher.

Referring now to FIG. 4, a chart 36 illustrating wafer acceptance test (WAT) results for a standard DDDMOS device without (W/O) the resistance protection oxide (RPO) and for the embodiment DDDMOS device 10 of FIG. 1 are provided. Notably, numerical values (in μm) for the various dimensions labeled in FIG. 1, namely W, L, B, S1, D, and S2, have been included in FIG. 4. Moreover, both symmetrical and asymmetrical PMOS device results have been provided.

Figure 5:
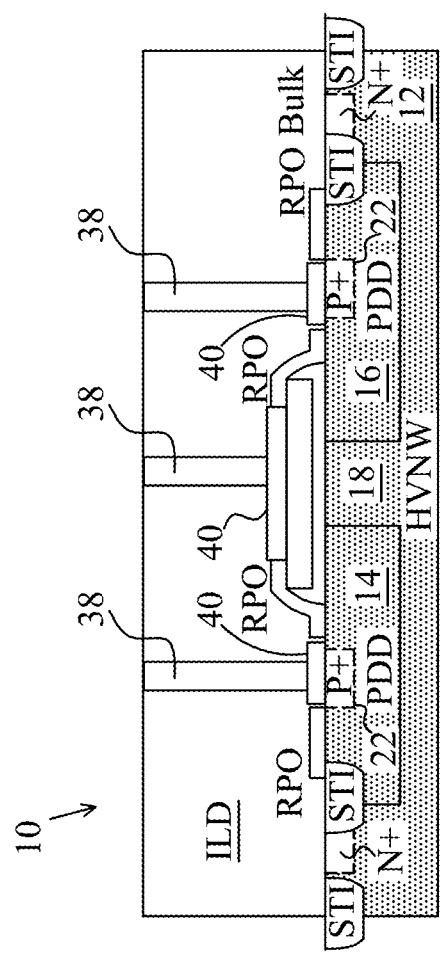
FIG. 5 is a cross section of the embodiment DDDMOS device of FIG. 1 having silicide formed beneath contact plugs.

Referring now to FIG. 5, the embodiment DDDMOS device 10 is depicted with contact plugs 38. As shown, a layer of silicide 40 is formed or resides between the outer contact plugs 38 and the source/drain regions 22 and between the central contact plug 38 and the gate 20. As shown, the resistance protection oxide 26 beneficially inhibits or prevents the formation of the silicide 40 over portions of the adjacent first and second doped regions 14, 16.

Figure 6:
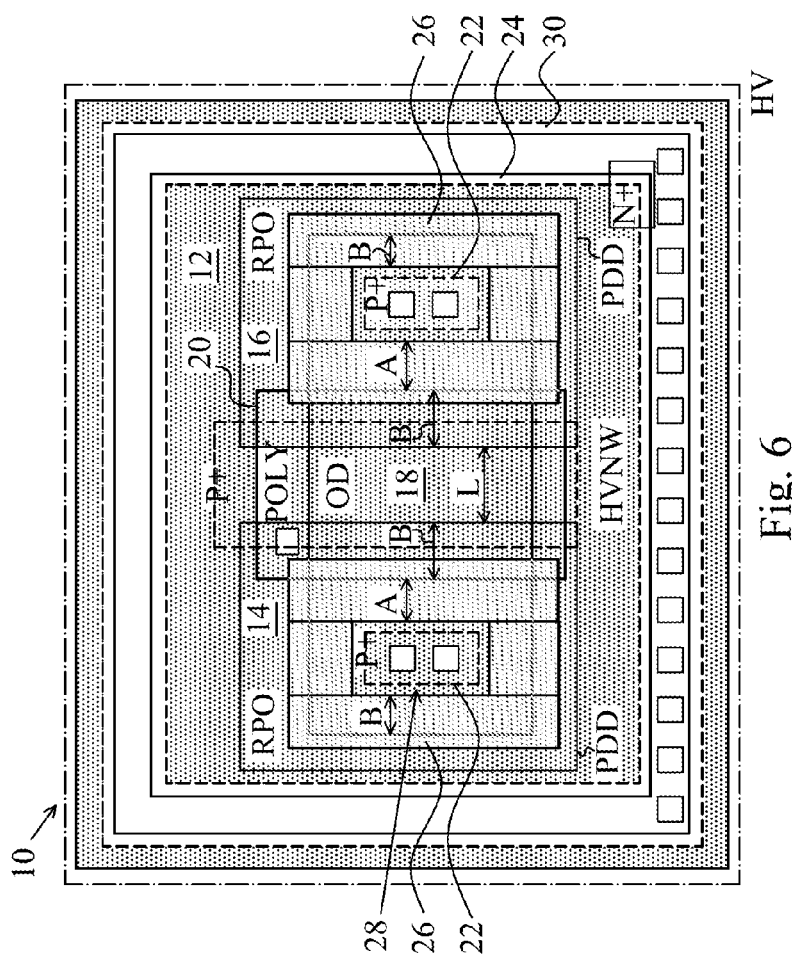
FIG. 6 is a top plan view of the embodiment DDDMOS device of FIG. 1 with certain dimensions illustrated.
Figure 7:
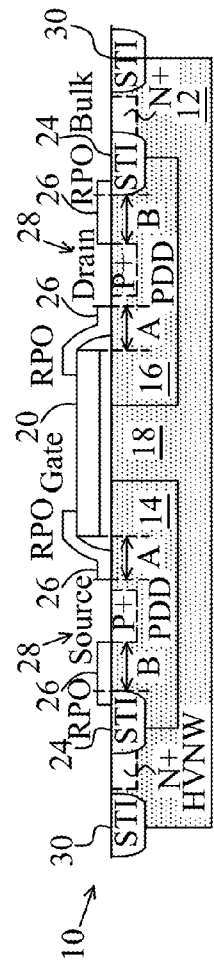
FIG. 7 is a cross sectional view of the embodiment DDDMOS device of FIG. 6.

Referring now to FIGS. 6-7, the embodiment DDDMOS device 10 has various dimensions labeled, namely A and B. In general, A is the distance from an end of a polysilicon gate 20 to a terminal end of the resistance protection oxide 26 and B is the distance from an edge of the first isolation regions 24 to an edge of the source/drain regions 22. In an embodiment, B is about 0.5 to about 1.5 times A. By way of example, if A is about 0.8 μm, then B is between about 0.4 μm to about 1.2 μm.

Figure 8:
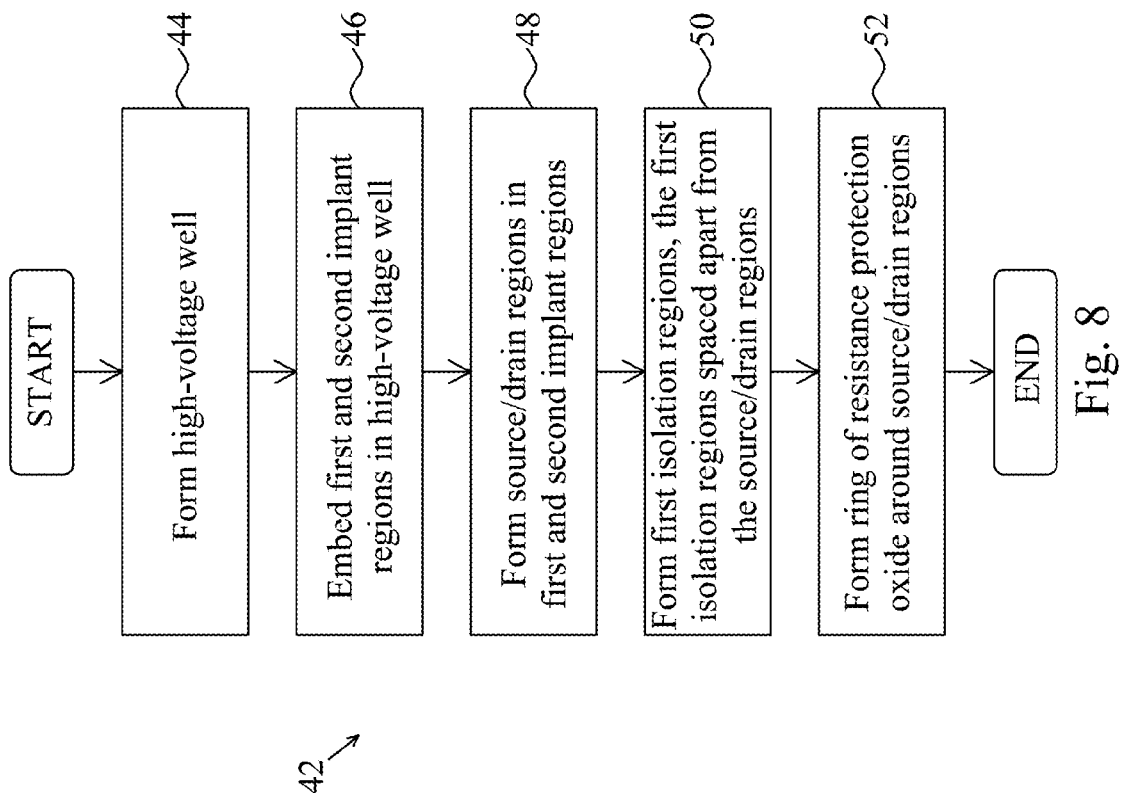
FIG. 8 is a flow diagram illustrating a method of forming the embodiment DDDMOS device of FIG. 1.

Referring now to FIG. 8, a flow diagram illustrating a method 42 of forming the embodiment DDDMOS device 10 of FIG. 1 is provided. In block 44, a high-voltage well 12 having the first doping type is formed. In block 46, the first doped region 14 and the second doped region 16 are embedded in the high-voltage well 12. As noted above, the first and second doped regions 14, 16 have the second doping type and are spaced apart by the channel 18 in the high-voltage well 12.

In block 48, source/drain regions 22 are formed in the first doped region 14 and in the second doped region 16. Each of the source/drain regions 22 has the second doping type and more heavily doped than the first and second doped regions 14, 16. In block 50, the first isolation regions 24 are formed. The first isolation regions 24 are spaced apart from each of the source/drain regions 22.

In block 52, the ring 26 of resistance protection oxide 26 is formed around each of the source/drain regions 22. By forming the ring 26 in this manner generating the window 28 (FIG. 1), the DDDMOS device 10 of FIG. 1 has a high breakdown voltage relative to conventional DDDMOS devices. In addition, the embodiment DDDMOS device 10 also has a comparable on resistance RDS(on) and mismatch relative to conventional DDDMOS devices.

An embodiment integrated circuit includes a high-voltage well having a first doping type, a first doped region and a second doped region embedded in the high-voltage well, the first and second doped regions having a second doping type and spaced apart by a channel in the high-voltage well, source/drain regions formed in the first doped region and in the second doped region, each of the source/drain regions having the second doping type and more heavily doped than the first and second doped regions, first isolation regions spaced apart from each of the source/drain regions, and resistance protection oxide over the high-voltage well forming a ring surrounding each of the source/drain regions.

An embodiment integrated circuit includes a high-voltage well having a first doping type, a first doped region and a second doped region embedded in the high-voltage well, the first and second doped regions having a second doping type and spaced apart by a channel in the high-voltage well, source/drain regions formed in the first doped region and in the second doped region, each of the source/drain regions having the second doping type and more heavily doped than the first and second doped regions, isolation regions spaced apart from each of the source/drain regions, and resistance protection oxide forming a window, the window at least one of aligned with and partially overlapping each of the source/drain regions.

An embodiment method of forming an integrated circuit includes forming a high-voltage well having a first doping type, embedding a first doped region and a second doped region in the high-voltage well, the first and second doped regions having a second doping type and spaced apart by a channel in the high-voltage well, forming source/drain regions in the first doped region and in the second doped region, each of the source/drain regions having the second doping type and more heavily doped than the first and second doped regions, forming first isolation regions, the first isolation regions spaced apart from each of the source/drain regions, and forming a ring of resistance protection oxide around each of the source/drain regions.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. An integrated circuit, comprising:
a high-voltage well having a first doping type;
a first doped region and a second doped region embedded in the high-voltage well, the first and second doped regions having a second doping type and spaced apart by a channel in the high-voltage well;
a source region in the first doped region and a drain region in the second doped region, each of the source and drain regions having the second doping type and more heavily doped than the first and second doped regions;
first and second isolation regions, the first isolation region spaced apart from the source region and the second isolation region spaced apart from the drain region; and
first and second resistance protection oxide rings over the high-voltage well, each of the first and second resistance protection oxide rings forming a ring surrounding respective ones of the source region and the drain region.

2. The integrated circuit of claim 1, wherein the first resistance protection oxide ring overlies the first doped region disposed between the source region and the first isolation region and wherein second resistance protection oxide ring overlies the second doped region disposed between the drain region and the second isolation region.

3. The integrated circuit of claim 1, wherein the first isolation region is laterally spaced apart from the source region by portions of the first doped region, and wherein the second isolation region is laterally spaced apart from the drain region by portions of the second doped region.

4. The integrated circuit of claim 1, wherein each of the first and second resistance protection oxide rings include a portion disposed on a side of the corresponding source region and drain region opposite the channel.

5. The integrated circuit of claim 1, wherein a portion of each of the first and second resistance protection oxide rings overlies a gate structure formed over the channel.

6. The integrated circuit of claim 1, wherein the first resistance protection oxide ring partially overlaps the first isolation region.

7. The integrated circuit of claim 1, wherein an end of the first resistance protection oxide ring is at least one of vertically aligned with and partially overlapping an end of the source region.

8. The integrated circuit of claim 1, wherein the first resistance protection oxide ring is a rectangular ring.

9. The integrated circuit of claim 1, wherein a first distance from an edge of the first isolation region to an edge of source region is about 0.5 to about 1.5 times a second distance from an end of a polysilicon gate to a terminal end of the first resistance protection oxide ring.

10. The integrated circuit of claim 9, wherein the first distance is about 0.4 μm to about 1.2 μm and the second distance is about 0.8 μm.

11. The integrated circuit of claim 1, wherein a breakdown voltage is greater than about 38 Volts.

12. The integrated circuit of claim 1, wherein a third isolation is spaced apart from the first isolation region by a third doped region, the third doped region having the first doping type and more heavily doped than the high-voltage well.

13. The integrated circuit of claim 1, wherein the first doping type is an n-type dopant and the second doping type is a p-type dopant.

14. An integrated circuit, comprising:
a high-voltage well having a first doping type;
a first doped region and a second doped region embedded in the high-voltage well, the first and second doped regions having a second doping type and spaced apart by a channel in the high-voltage well;
first and second source/drain regions, the first source/drain region formed in the first doped region and the second source/drain region formed in the second doped region, each of the first and second source/drain regions having the second doping type and more heavily doped than the first and second doped regions; and
first and second resistance protection oxide, each of the first and second resistance protection oxide forms a window least partially overlying respective ones of the first and second doped regions.

15. The integrated circuit of claim 14, wherein at least a portion of each of the first and second resistance protection oxide overlie an isolation region.

16. The integrated circuit of claim 14, further comprising a first isolation region laterally spaced apart from the first source/drain region by portions of the first doped region and further comprising a second isolation region laterally spaced apart from the second source/drain region by portions of the second doped region.

17. The integrated circuit of claim 14, wherein the first and second resistance protection oxide have a shape of at least one of a square and a rectangular ring.

18. An integrated circuit, comprising:
a first well having a first doping type;
a first doped region and a second doped region embedded in the first well, the first and second doped regions having a second doping type and spaced apart by a channel;
a first source/drain region in the first doped region and a second source/drain region in the second doped region, each of the first and second source/drain regions having the second doping type and more heavily doped than the first and second doped regions; and
a first resistance protection ring encircling the first source/drain region in a plan view and a second resistance protection ring encircling the second source/drain region in a plan view.

19. The integrated circuit of claim 18, wherein the first resistance protection ring and the second resistance protection ring overlaps a gate.

20. The integrated circuit of claim 18, wherein the first resistance protection ring and the second resistance protection ring overlaps a shallow trench isolation.

* * * * *